United States Patent
Lumb

(10) Patent No.: US 12,443,210 B2
(45) Date of Patent: Oct. 14, 2025

(54) EFFICIENT MONOLITHIC OPTOCOUPLER DEVICE

(71) Applicant: The George Washington University, Washington, DC (US)

(72) Inventor: Matthew Lumb, Alexandria, VA (US)

(73) Assignee: The George Washington University, Washington, DC (US)

( * ) Notice: Subject to any disclaimer, the term of this patent is extended or adjusted under 35 U.S.C. 154(b) by 986 days.

(21) Appl. No.: 17/466,168

(22) Filed: Sep. 3, 2021

(65) Prior Publication Data

US 2021/0397209 A1 Dec. 23, 2021

Related U.S. Application Data

(63) Continuation of application No. 16/563,463, filed on Sep. 6, 2019, now Pat. No. 11,137,784.

(60) Provisional application No. 62/824,037, filed on Mar. 26, 2019, provisional application No. 62/800,805, filed on Feb. 4, 2019, provisional application No. 62/800,809, filed on Feb. 4, 2019, provisional application No. 62/728,463, filed on Sep. 7, 2018.

(51) Int. Cl.
| | |
|---|---|
| *H10F 55/255* | (2025.01) |
| *G05F 1/575* | (2006.01) |
| *H10F 77/40* | (2025.01) |

(52) U.S. Cl.
CPC ........... *G05F 1/575* (2013.01); *H10F 55/255* (2025.01); *H10F 77/413* (2025.01)

(58) Field of Classification Search
CPC . H01L 31/02327; H01L 33/173; G05F 1/575; H10F 55/255; H10F 27/413
See application file for complete search history.

(56) References Cited

U.S. PATENT DOCUMENTS

| | | |
|---|---|---|
| 3,617,859 A | 11/1971 | Dobkin et al. |
| 4,275,404 A | 6/1981 | Cassiday et al. |
| 4,673,864 A | 6/1987 | Dessens et al. |

(Continued)

OTHER PUBLICATIONS

Wilkins et al., "Ripple-Free Boost-Mode Power Supply Using Photonic Power Conversion", IEEE Transactions on Power Electronics, vol. 34, No. 2, Feb. 2019, pp. 1054-1064.

(Continued)

*Primary Examiner* — Nathan W Ha
(74) *Attorney, Agent, or Firm* — BLANK ROME LLP

(57) ABSTRACT

An efficient monolithic optocoupler device that includes a photovoltaic region, an electrically isolating region, and a light emitting region deposited on a substrate in a single stack. The electrically isolating region (e.g., one or more diodes or resistive semiconductor layers) allows photons to pass from the light emitting region to the photovoltaic region while blocking electrical current between those regions. In some embodiments, the optocoupler device includes a reflector on a side of the light emitting region (opposite the photovoltaic region) that reflects photons emitted by the light emitting region back toward the photovoltaic region. The optocoupler device may also include a reflector on a side of the photovoltaic region (opposite the light emitting region) that reflects photons emitted by the light emitting region back toward the photovoltaic region. In other embodiments, the optocoupler device includes two photovoltaic regions sandwiching the light emitting region.

17 Claims, 17 Drawing Sheets

(56) References Cited

U.S. PATENT DOCUMENTS

| | | |
|---|---|---|
| 5,187,446 A | 2/1993 | Daly |
| 5,189,307 A | 2/1993 | Fabian |
| 5,635,408 A * | 6/1997 | Sano ............... H10F 71/107 |
| | | 136/249 |
| 5,659,204 A | 8/1997 | Miller |
| 5,753,928 A | 5/1998 | Krause |
| 5,949,225 A | 9/1999 | Sawtell |
| 6,188,212 B1 | 2/2001 | Larson et al. |
| 7,800,037 B2 | 9/2010 | Sawtell et al. |
| 8,097,868 B2 | 1/2012 | Monaco et al. |
| 8,674,681 B2 | 3/2014 | Nanayakkara |
| 8,873,211 B1 | 10/2014 | Butler |
| 8,934,267 B2 | 1/2015 | He et al. |
| 9,647,162 B2 | 5/2017 | Hodges |
| 10,636,926 B1 * | 4/2020 | McGlynn ........... H01L 31/078 |
| 11,251,209 B1 * | 2/2022 | Yap ............... H01L 31/02363 |
| 2001/0033190 A1 | 10/2001 | Bendall |
| 2004/0079961 A1 * | 4/2004 | Taylor ................ H03M 1/74 |
| | | 257/E21.387 |
| 2007/0053643 A1 * | 3/2007 | West ................. G02B 6/132 |
| | | 385/131 |
| 2009/0187925 A1 | 7/2009 | Hu |
| 2009/0294787 A1 * | 12/2009 | Nakaji ............. H01S 5/18361 |
| | | 257/98 |
| 2010/0225249 A1 | 9/2010 | Liao |
| 2011/0018590 A1 | 1/2011 | Tai |
| 2012/0153417 A1 * | 6/2012 | Shi ............... H01L 31/02327 |
| | | 257/E31.128 |
| 2012/0192924 A1 | 8/2012 | Basol |
| 2013/0000702 A1 * | 1/2013 | Demirkan ........... H10F 77/126 |
| | | 438/73 |
| 2013/0037095 A1 * | 2/2013 | Forrest ............ H01L 31/02327 |
| | | 257/E31.02 |
| 2014/0008660 A1 * | 1/2014 | Jorgenson ........... H01L 31/1856 |
| | | 257/76 |
| 2014/0015426 A1 | 1/2014 | Kraft |
| 2014/0261689 A1 * | 9/2014 | Buller ................ H10F 10/162 |
| | | 438/85 |
| 2015/0214425 A1 * | 7/2015 | Taylor ............. H01L 31/02327 |
| | | 257/14 |
| 2015/0261338 A1 * | 9/2015 | Shimizu ............... G01S 17/04 |
| | | 250/206.1 |
| 2015/0280042 A1 * | 10/2015 | Wanlass ............. H01L 31/0735 |
| | | 136/255 |
| 2016/0294385 A1 | 10/2016 | Vazach et al. |
| 2017/0092800 A1 * | 3/2017 | Derkacs ............. H01L 31/078 |
| 2017/0311396 A1 | 10/2017 | Sadwick |
| 2018/0219625 A1 | 8/2018 | Seki |
| 2018/0220502 A1 | 8/2018 | Morales |
| 2018/0254357 A1 * | 9/2018 | Derkacs ............. H01L 31/0687 |
| 2019/0335552 A1 | 10/2019 | Iqbal |
| 2019/0386170 A1 * | 12/2019 | Jain ............... H01L 31/02327 |
| 2020/0227448 A1 * | 7/2020 | Tseng ............... H01L 27/14685 |

OTHER PUBLICATIONS

International Search Report and Written Opinion for PCT/US2019/050042, dated Nov. 20, 2019, 10 pages.

"Voltage Regulation and Power Conversion", Art of Electronics Third Edition, 1980, 1989, 2015, 8 pgs.

Toshiba Photocoupler GaAℓAs Ired & Photo-diode Array—TLP590B, Toshiba, Jun. 7, 2017; 6 pgs.

* cited by examiner

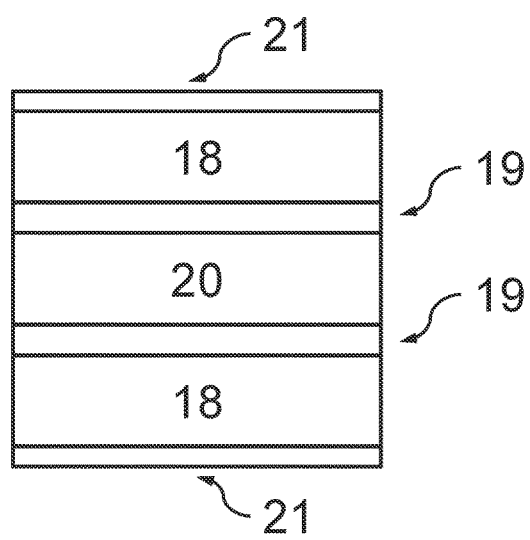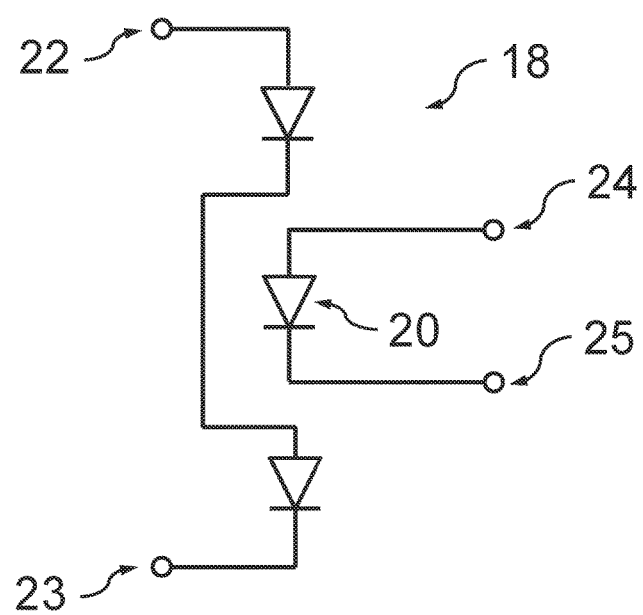
Figure 9(a)
Figure 9(b)

Figure 12(a)
Figure 12(b)
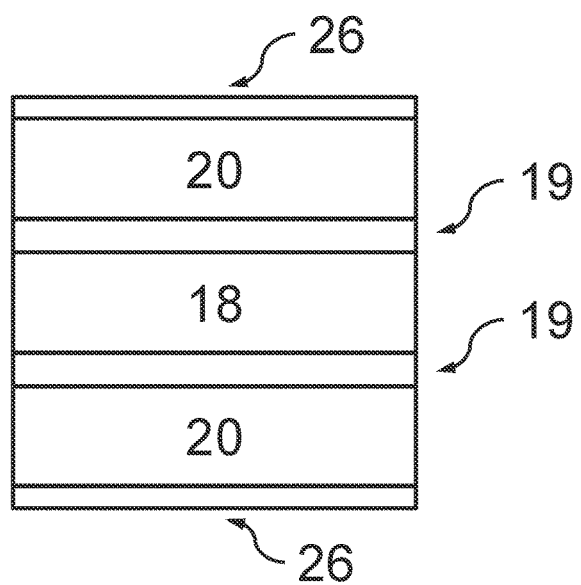
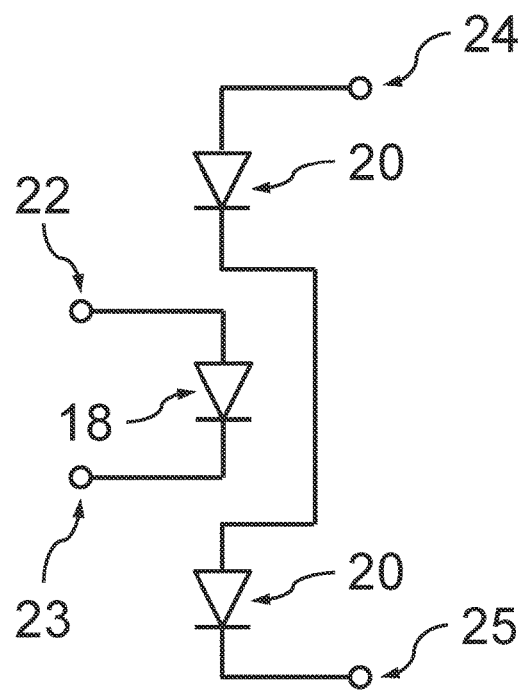

EFFICIENT MONOLITHIC OPTOCOUPLER DEVICE

RELATED APPLICATIONS

This application is a continuation of U.S. application Ser. No. 16/563,463, filed Sep. 6, 2019, which claims the benefit of U.S. Provisional Application No. 62/728,463, filed Sep. 7, 2018, Provisional Application No. 62/800,805, filed Feb. 4, 2019, Provisional Application No. 62/800,809, filed Feb. 4, 2019, and Provisional Application No. 62/824,037, filed Mar. 26, 2019. The entire contents of those applications are incorporated by reference.

BACKGROUND OF THE INVENTION

DC-DC conversion is a very common element of a variety of circuits. Very efficient step down ("buck") converters and step up ("boost") converters are available, which use a switching technique to regulate the voltage. However, there are several drawbacks to switching DC-DC converters. Firstly, they require additional components such as inductors and capacitors, which increase the footprint and cost of the solution. Also, high-frequency switching introduces voltage ripple, which can create problems in noise-sensitive applications and requires additional design complexity to suppress. Also, switching converters are susceptible to electromagnetic interference effects which can create a variety of problems in electronic circuits.

Alternative devices for DC-DC conversion are linear voltage regulators, which are less complex than switching converters, require fewer external components and there is no noise generated by switching. Therefore, these devices can be low cost, insensitive to EMI and a very compact alternative to switching converters. However, there are two main drawbacks with linear voltage regulators. The first is that they only step down voltage, severely limiting the cases where the devices can be employed. The input voltage is required to be greater than the output voltage by an amount known as the dropout voltage, which in low dropout (LDO) linear regulators can be as low as 50-100 mV, or as high as 2V in conventional linear voltage regulators. The second drawback is that their efficiency is generally lower, especially when the difference between input and output voltages is large. In battery operated systems this equates to increased battery drainage and significant amounts of waste heat generation.

SUMMARY OF THE INVENTION

In this invention, a device is provided that operates in the manner of a linear voltage regulator, but with the functionality of a switching converter. This concept enables DC voltage up-conversion with no switching, more efficient step down of large voltage steps, and requires no expensive and bulky additional components. At the heart of the invention is an optocoupler device which transfers power between light emitting and photovoltaic devices.

BRIEF DESCRIPTION OF THE DRAWINGS

FIGS. 9(*a*), 9(*b*) show a voltage reducing optocoupler device with multiple light emitting regions stacked vertically;

FIGS. 12(*a*), 12(*b*) show a voltage reducing optocoupler device with multiple photovoltaic regions stacked vertically;

DETAILED DESCRIPTION OF THE INVENTION

Figure 1:
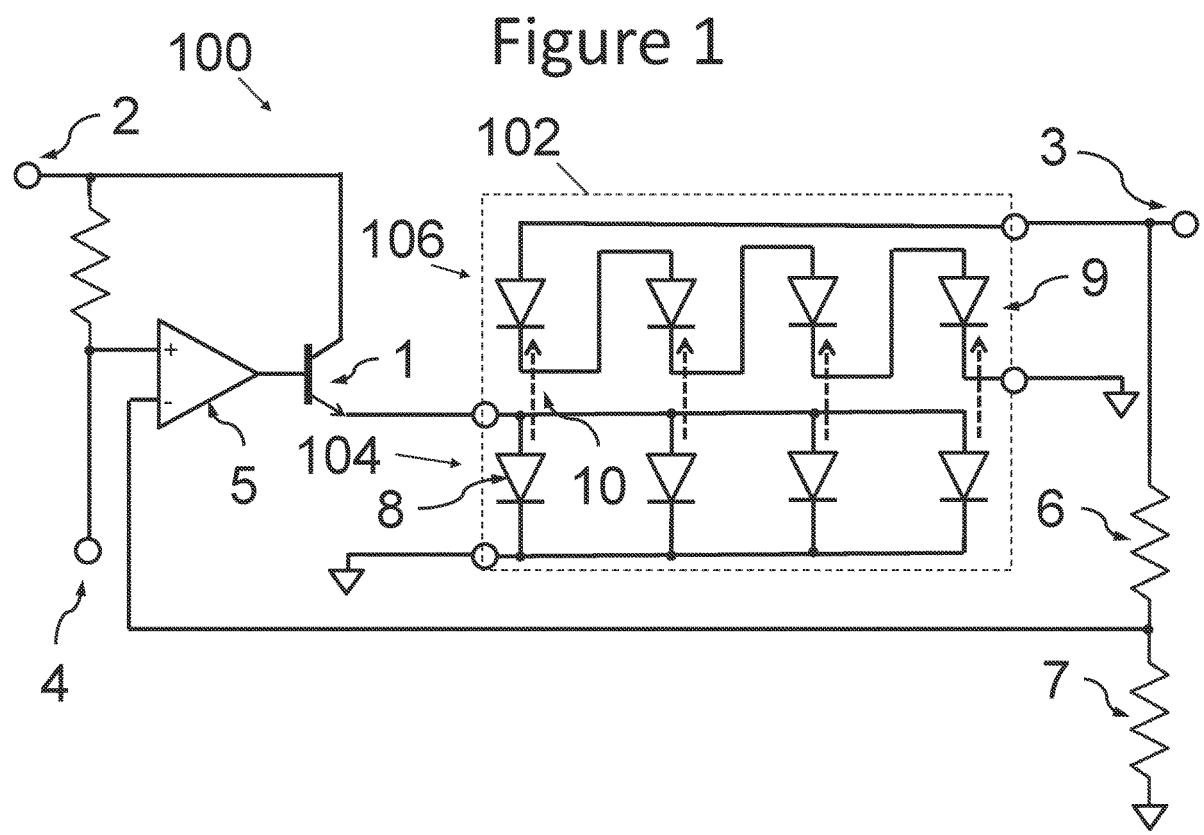
FIG. 1 is a circuit diagram of a linear voltage regulator having an optocoupler section in accordance with one embodiment of the invention.

In describing the illustrative, non-limiting embodiments of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several embodiments of the invention are described for illustrative purposes, it being understood that the invention may be embodied in other forms not specifically shown in the drawings.

A standard linear voltage regulator operates by taking an unregulated input, $V_{in}$, and producing a regulated output, $V_{out}$. The regulation is achieved by a variable voltage drop across a transistor connected to the output. The transistor is controlled by an error amplifier which compares the output voltage to a voltage reference, $V_{ref}$. In this circuit, $V_{out}$ is always lower than $V_{in}$. Very low dropout voltages can be achieved by modifying this basic circuit to use a common emitter output stage as described, for example, in Horowitz & Hill *"The Art of Electronics"*.

Turning to the drawings, FIG. 1 shows one illustrative, non-limiting embodiment of the improved linear voltage regulator circuit 100 of the invention. The circuit 100 includes a transistor 1, an amplifier 5, and an optocoupler section 102. The optocoupler section 102 has a light emitting section 104 comprising an array of LEDs 8, and a photovoltaic section 106 comprising an array of photovoltaic devices 9. The photovoltaic device 9 can be any suitable devices, for example a photosensor, photodetector, solar cell, or a semiconductor junction (e.g., p-n junction) that has an anode and cathode contact and absorbs external photons above the bandgap of the lowest bandgap material in the device, which can be extracted as electrical current in an external circuit.

The transistor 1 is not connected to the output, as in a conventional voltage regulator, but rather to one or more light emitting diodes 8 connected in a combination of series or parallel connected strings. The circuit has a transistor 1 connected to an input terminal 1 with an unregulated voltage. The circuit is shown with a npn bipolar junction transistor, but analogous operation could be achieved using other types of transistor, such as a MOSFET. The function of the circuit is to produce a regulated voltage output at the output terminal 3.

A third terminal 4 provides a voltage reference, which may be an external voltage source, a suitable diode or other similar component for providing a voltage reference. The voltage drop across transistor 1 is controlled by an error amplifier 5 which compares the voltage at the output terminal 3 through a potential divider, formed by resistors 6 and 7, with the voltage reference at the reference terminal 4. The error amplifier 5, when in a feedback loop, generates a voltage which stabilizes the output voltage and minimizes the difference between the reference and the feedback voltage.

Thus, in the embodiment shown, the amplifier has a first input connected to the voltage reference 4, and a second input connected to the output terminal 3 through the potential divider. Specifically, the first and second resistors 6, 7 of the voltage divider are connected in series with the second input of the amplifier 5 connected therebetween. The first resistor 6 has a first end that is connected to the output terminal 3 and a second end that is connected to a first end of the second resistor 7. The second end of the second resistor 7 is connected to ground. The second input to the amplifier 5 is connected to the second end of the first resistor 6 and the first end of the second resistor 7.

The potential divider provides the feedback voltage which is compared to the reference voltage in the amplifier. The feedback voltage is a fraction of the output voltage, controlled by the resistors' values, thereby controlling the regulated voltage output. By changing the values of these resistors, the voltage regulator can be modified to produce different output voltages (some designs of regulator ICs require separate resistors to be connected off the chip, others have the resistors built-in to the IC). Using a variable resistor as one or both of the resistors in the divider is an easy way to make a variable voltage regulator.

The output from the amplifier 5 is connected to the base of the transistor 1, and the collector of the transistor is connected to the input terminal 2. The connection between the voltage reference 4 and the input terminal 2 is optional and depends on the type of voltage reference being used. If the voltage reference is a diode then the diode is connected to the input 2 through a resistor. If an external reference (e.g. power supply) is used as a reference, terminal 4 does not have to be connected to the input terminal 2.

In addition, the emitter of the transistor 1 is connected to a light emitting section 104. The light emitting section 104 is an array of one or more light emitting diodes (LEDs) 8 which are connected in any combination of series and parallel interconnections. The light emitter section 104 example shown in FIG. 1 has four LED devices 8 connected in parallel. The LEDs 8 transmit photons to a photovoltaic section 106, which is an array of one or more photovoltaic (PV) devices 9 connected in a combination of series or parallel strings. The direction of photon transfer follows the arrow shown by 10, and therefore the bandgap energy of the PV devices is required to be equal to or less than the energy of photons emitted by the LED devices—but only the narrowest bandgap part of the PV device is needed to have a bandgap equal to or less than the emission energy of the LED. For example, the PV device may comprise a heterojunction having a wide bandgap n region and a narrower bandgap p region. A PV device 9 is aligned with a respective LED 8 to receive and detect light emitted from the LED 8. The LEDs 8 emit a light in response to a signal received from the emitter of the transistor 1.

The transistor 1 provides a fraction of the input voltage to the LEDs 8, controlled by the amplifier feedback loop. The intensity and wavelength of the light from each LED 8 is substantially the same, although series resistance and real-world variations in LEDs make that an approximation. The fraction of the input voltage 2 not passed to the LED 8 array is given up as heat in the transistor 1. The output from the last PV device 9 in the series connects to the output terminal 3.

The PV section 106 has four PV devices 9 connected in series. The LED and PV devices may be separate components, or monolithic devices with high impedance between the terminals of the LED and PV sections. The PV section is connected to the output terminal 3. There is no requirement for the number and performance attributes of the LED and PV devices in their respective strings to be identical. For example, it is possible that one large LED device 8 could pass photons to several smaller PV devices 9, or conversely, one large PV device 9 could absorb photons from several smaller LEDs 8. By using different combinations of series and parallel connections of the LED 8 and PV devices 9, step-up or step-down voltage conversion is possible with this scheme.

For simplicity, no additional circuit elements for overcurrent protection or stability are shown in FIG. 1. A variety of capacitors, resistors and transistors may be added to the circuit to improve stability and protect against short circuits, but do not govern the basic operating principle of the regulator device. The voltage produced across the terminals of the PV section 106 provides a voltage boost at the output of the optocoupler section 102 relative to the input of the optocoupler section 102. For example, the voltage across the PV section 106 is greater by a factor of roughly 4× relative to the voltage across the LED section when the bandgap energies of the LED 8 and PV devices 9 are very similar.

More specifically, photovoltaic devices in series add their voltages, analogous to connecting batteries in series. Thus, for example, consider 4 LEDs in parallel and 4 PV devices in series where the PV and LED bandgaps are very similar and the LED luminescence is coupled to the PV devices. Neglecting optical and electrical losses for the simplicity of this example, the voltage produced by the PV array will be roughly 4× greater than the voltage input to the LED array, whereas the current produced by the PV array will be roughly 4× smaller than the current input to the LED array, thereby ensuring the output power from the PV array cannot exceed the power input to the LED array. In practice, electrical and optical losses will reduce the voltage boost to less than 4× and reduce the current output of the PV array to less than ¼ of the LED input, resulting in significantly less than unity power transfer efficiency of the optocoupler, where power transfer efficiency has been defined as the output power from the PV array as a fraction of the input power to the LED array.

In general, the design of the LED section 104 and PV section 106 are designed such that the output voltage is close to the maximum power voltage of the PV section 106 under typical operating voltage ranges, which provides the highest efficiency of electrical power out of the PV section 106 per incident light power.

The linear regulator 100 has a feedback loop that regulates the voltage. The voltage reference 4 is compared to the voltage across the potential divider. The amplifier 5 minimizes the difference between the reference voltage 4 and the feedback voltage, by controlling the voltage drop across the transistor 1. The optocoupler section or device 102 provides additional voltage reduction or voltage boost between the input and output sides, which enables either voltage upconversion, or more efficient voltage down conversion.

In FIG. 1, all the power is transferred between the light emitter and the PV devices. The efficiency of the optocoupler is less than unity, so if there were no voltage boosting or voltage reduction going on in the optocoupler section 102, therefore comparable to a conventional voltage regulator, the efficiency would be lower using the optocoupler. However, when stepping down large voltage steps, reducing voltage in the optocoupler section enables a higher efficiency than a conventional linear regulator where the entire voltage difference is dissipated as heat in the transistor 1. Furthermore, by employing an optocoupler which enables voltage boosting, DC-DC upconversion can be achieved using a device which retains the advantages of a linear regulator in simplicity, low EMI and low voltage ripple.

Figure 2:
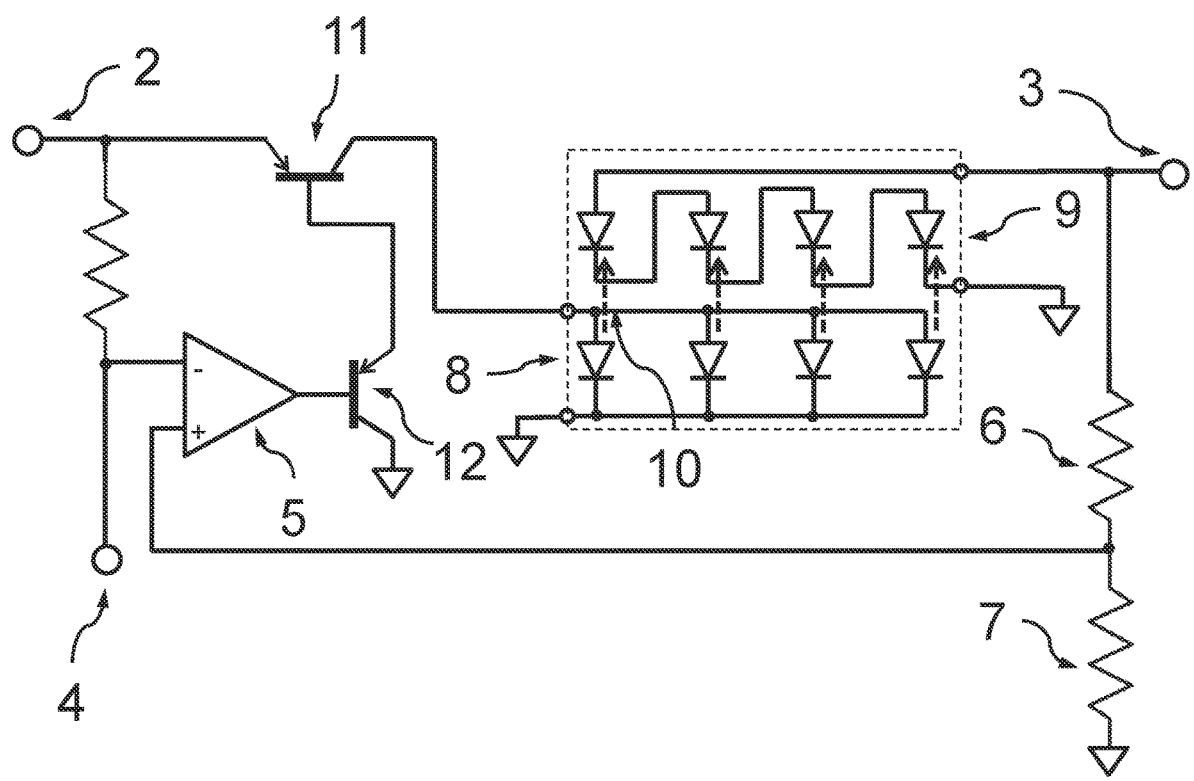
FIG. 2 is a low-dropout voltage regulator having an optocoupler section.

In FIG. 2, is a low dropout voltage regulator with an optocoupler section. It is a similar configuration to FIG. 1 to provide to connect LEDs and PV devices into voltage regulator circuits which are low dropout regulator circuits. Here, the circuit has an input terminal 2 with an unregulated voltage and produces a regulated voltage at the output terminal 3. As in FIG. 1, a third terminal 4 provides a voltage reference. The voltage drop between the input terminal 2 and the light emitting section 8 is now across a transistor 11 in a common emitter configuration, which in this example uses a pnp bipolar junction transistor. The emitter of the transistor 11 is connected to the input terminal 2, and the collector is connected to the LED section. The base of the transistor 11 is connected to the emitter of a second transistor 12 having a collector connected to ground. The second transistor 12 has a base that is connected to and controlled by an error amplifier 5, which compares the voltage at the output terminal 3 through a potential divider formed by resistors 6 and 7, with the voltage reference at the reference terminal 4, as in FIG. 1. It provides lower parasitic voltage loss in the transistor, so that the output voltage can be closer to the input voltage.

Also analogous to the example in FIG. 1, the transistor 11 is connected to a light emitting section, which is an array of one or more LEDs 8 connected in any combination of series and parallel connections. The LEDs 8 transmit photons to a photovoltaic section, having of one or more photovoltaic (PV) devices 9 connected in a combination of series or parallel strings. The direction of photon transfer follows the arrow shown by 10. As in FIG. 1, for simplicity, no additional circuit elements for overcurrent protection or stability are shown. A variety of capacitors, resistors and transistors may be added to the circuit to improve stability and protect against short circuits, but are not required to understand the basic operating principles of the regulator device.

For applications where the output voltage of the PV section 9 is greater than the input to the light emitting section 8, achieved by building voltage using series connections of PV devices, linear regulators with negative dropout voltage can be realized. In other words, this represents a linear regulator device capable of DC voltage boost conversion. Alternatively, when the output voltage of the PV section 9 is significantly less than the input voltage to the light emitting section 8, for example by using multiple LED devices in series, a greater efficiency for step-down conversion of large voltage steps can be achieved, compared to conventional linear regulators. Using conventional regulators for large voltage reduction, all the voltage change would be governed by the voltage drop across a transistor, leading to a significant amount of wasted power and producing heat. In the circuits of FIGS. 1 and 2, a fraction of the voltage drop can be achieved using the photon transfer process, thereby raising the efficiency overall.

Galvanic Isolation

Figure 3:
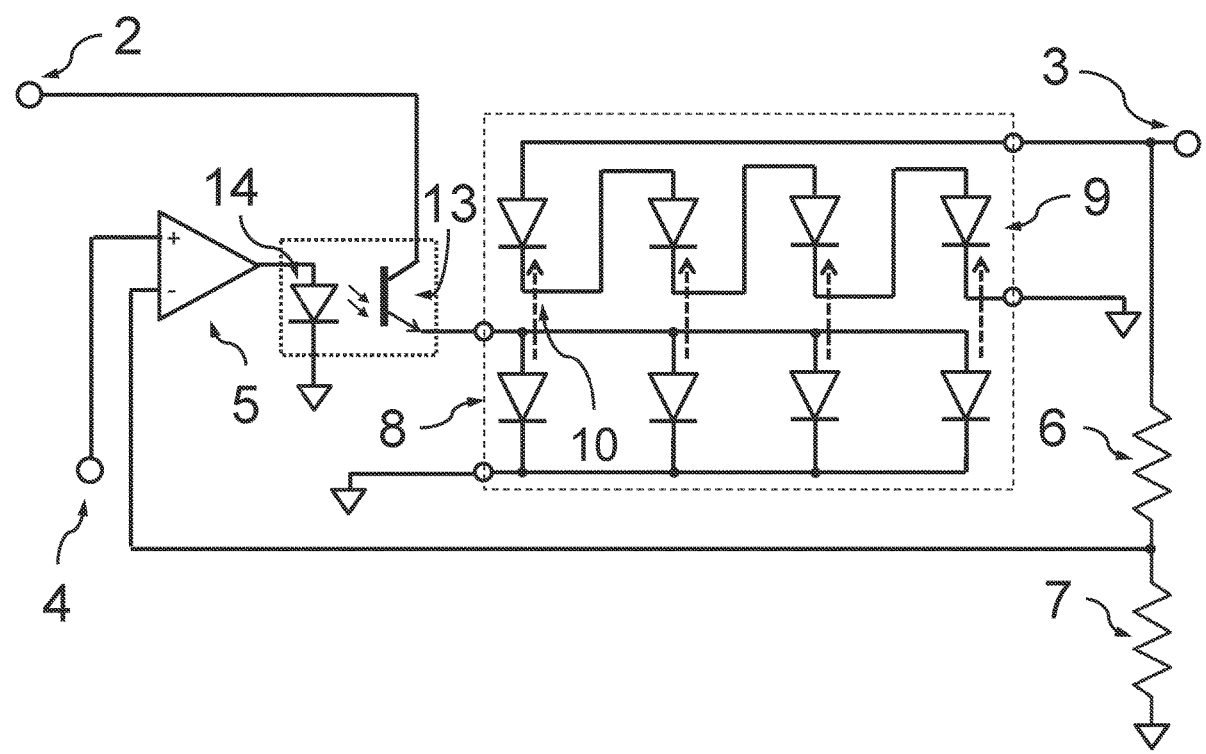
FIG. 3 is an alternative configuration having an LED and phototransistor.

FIG. 3 shows an alternative example, non-limiting design of the regulator described in FIGS. 1 and 2 can be used to create a linear voltage regulator device which has a high degree of galvanic isolation between the input and output sides of the device. The circuit has an input terminal 2 with an unregulated voltage and the function of the circuit is to produce a regulated voltage output at the output terminal 3. A third terminal 4 provides a voltage reference. Instead of a transistor, a phototransistor 13 is used to create a controlled voltage drop. The voltage drop across the phototransistor 13 is controlled by a light source such as a control light emitting device 14 as part of an optocoupler architecture. The control LED 14 is connected to the output of an error amplifier 5 which compares the voltage at the output terminal 3 through a potential divider, formed by resistors 6 and 7, with the voltage reference at the reference terminal 4, as in FIG. 1.

Figure 4:
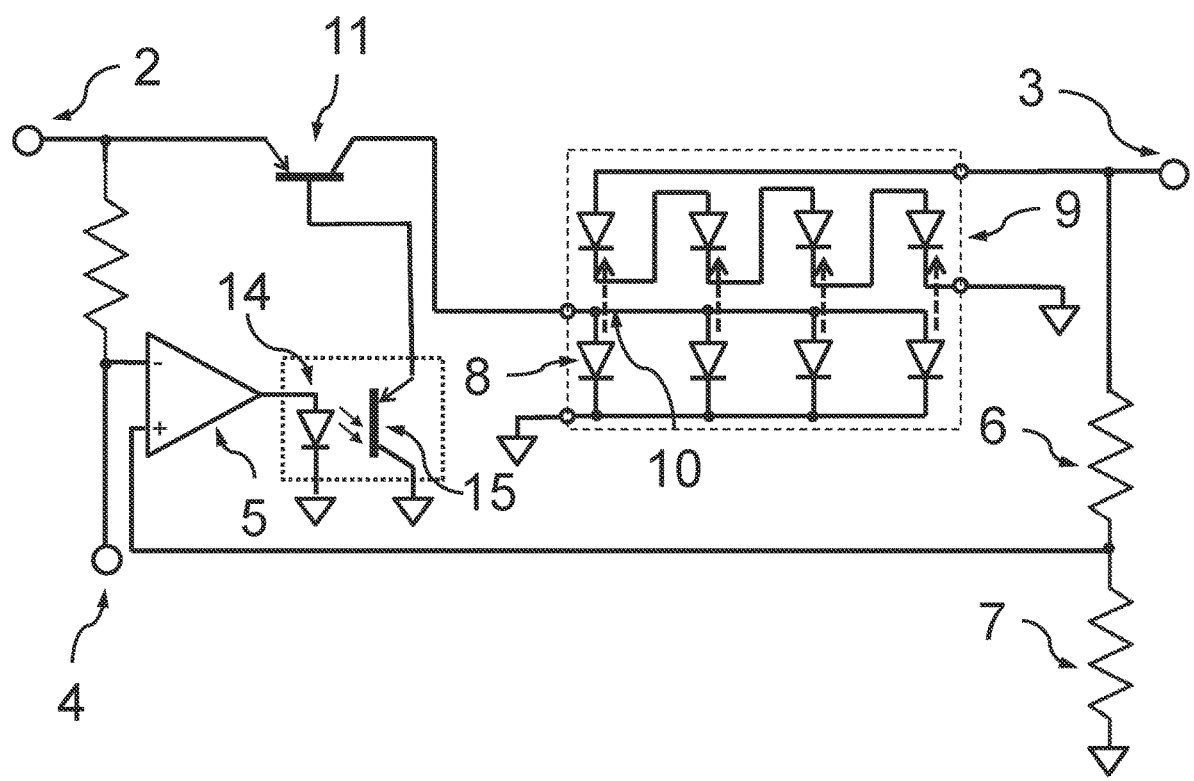
FIG. 4 is a circuit diagram of FIG. 3 with a second transistor.

The phototransistor 13 has a collector that is connected to the input 2. The emitter of the phototransistor 13 is connected to a light emitting section 8, which transmits photons to a photovoltaic section 9, entirely analogous to the schemes shown in FIGS. 1 and 2. Thus, in response to light received by the control LED 14, the phototransistor 13 provides a control signal to the LEDs 8. The direction of photon transfer follows the arrow shown by 10. In this embodiment, the input 2 and output 3 terminals are completely galvanically isolated, with the only current path between the two sides being via photon transfer. Furthermore, a similar circuit to FIG. 2 can be constructed by replacing the phototransistor output stage 13 with a common emitter output stage 11 controlled by a pnp phototransistor 15, as shown in FIG. 4.

In FIG. 3, the only way current can flow from the input to the output side is via photons (especially if the PV and LEDs are discrete components), which restricts the current level which can flow. Thus, it provides galvanic isolation, which can be a useful safety device preventing potentially dangerous electric shocks. Another important use for galvanic isolation is when the input and output sides of the circuit have different ground potentials.

High Efficiency Version

Figure 5:
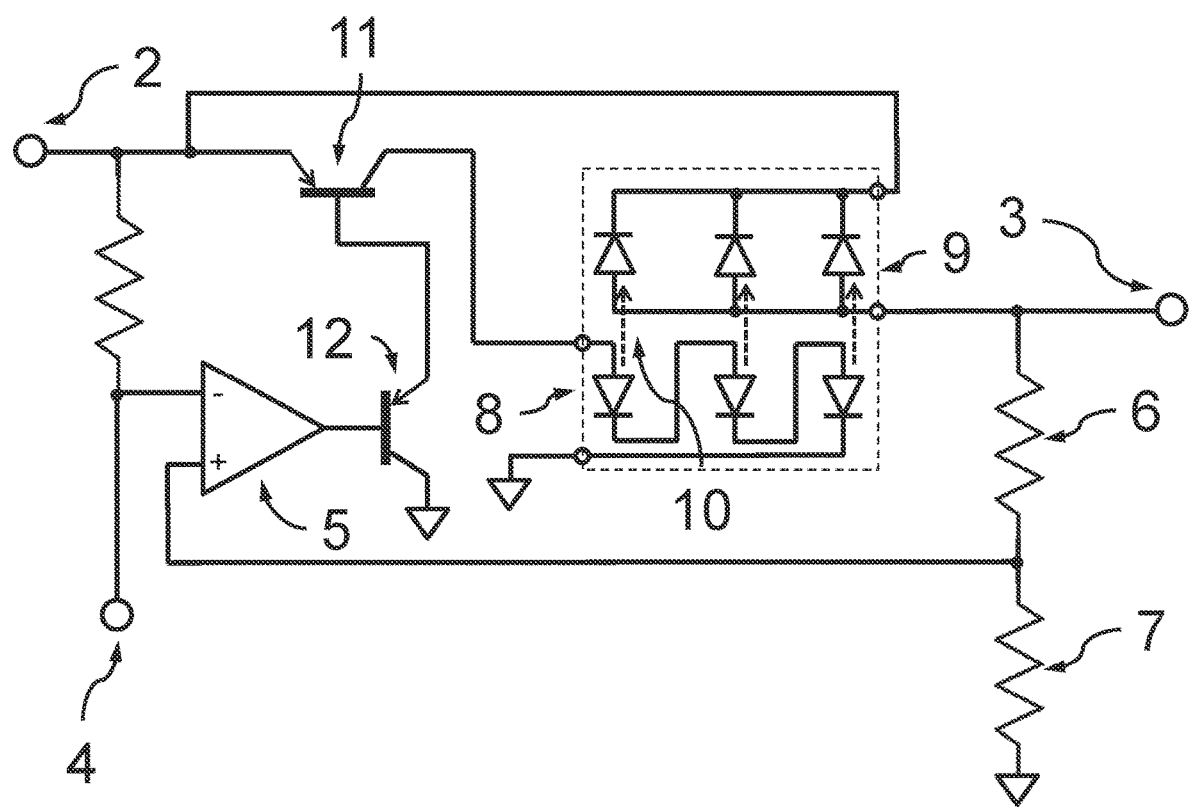
FIG. 5 is a circuit diagram with the second transistor connected to the photovoltaic devices.

FIG. 5 shows another alternative example non-limiting design of the regulator used to create DC voltage conversion with high efficiency. Here, the circuit has an input terminal 2 with an unregulated voltage and produces a regulated voltage at the output terminal 3). As in FIG. 1, a third terminal 4 provides a voltage reference, and the voltage drop between the input terminal 2 and the light emitting section 8 is across a transistor 11 in a common emitter configuration. The base of the transistor 11 is connected to the emitter of a second transistor 12. The second transistor 12 is controlled by an error amplifier 5 which compares the voltage at the output terminal 3 through a potential divider, formed by resistors 6 and 7, with the voltage reference at the reference terminal 4, as in FIG. 1.

Analogous to the example in FIG. 2, the transistor 11 is connected to a light emitting section 8. The LEDs transmit photons to a photovoltaic section, having one or more photovoltaic (PV) devices 9 connected in a combination of series or parallel strings. In the example shown in FIG. 5, three LEDs 8 connected in series are optically coupled to three PV devices 9 connected in parallel. When the bandgap energies of the LED and PV devices are similar, this configuration results in a roughly 3× reduction of the voltage across the PV section relative to the voltage across the LED section. The direction of photon transfer follows the arrow shown by 10.

Unlike FIGS. 1-4, in the embodiment in FIG. 5 the input terminal 2 is also connected directly to the PV section 9. By connecting one terminal of the photovoltaic string to the input, the photovoltaic action adds or subtracts to the voltage supplied to the load. In this configuration, only a fraction of the power supplied at the input is used to drive the light emitting section, and the overall efficiency can be significantly greater than if all the power from the input were routed through the light emitter section.

Figure 6:
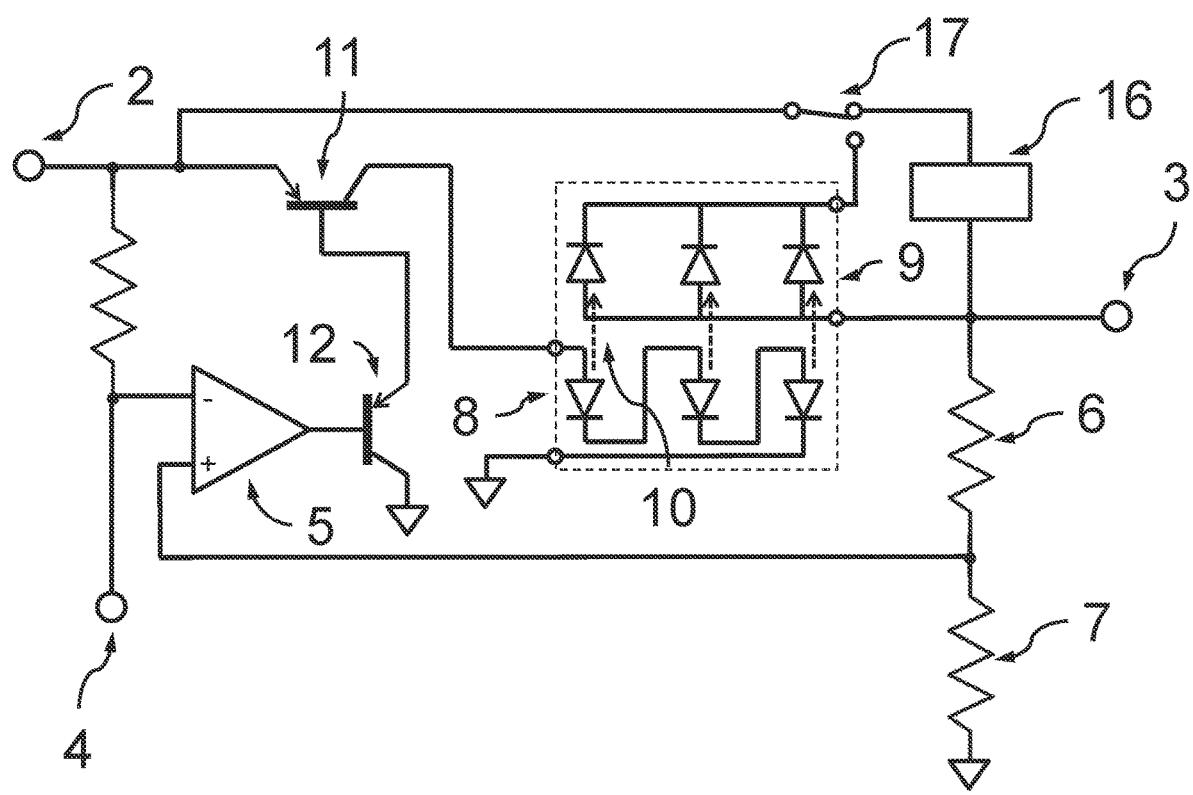
FIG. 6 is a circuit diagram having a linear regulator connected between the second transistor and the output.

In the example in FIG. 5, when the input side voltage exceeds the regulated output voltage, some of the unwanted power is dissipated in the photovoltaic section. To minimize this, another similar embodiment of the idea places a conventional linear regulator 16 in parallel with the circuit, as shown in FIG. 6. The input terminal of the linear regulator 16 is connected to the input terminal 2 of the device and the output terminal of the linear regulator 16 is connected the output terminal 3 of the device. All other aspects of the circuit are identical to the one shown in FIG. 5. When the input voltage at the input terminal 2 exceeds the input voltage threshold of the standard linear regulator 16, the power is largely diverted through the conventional regulator circuit. This can either be controlled by a switch, for example a single pole double throw switch 17, or by ensuring the output voltage from the conventional regulator is set to be slightly greater than the main voltage regulator.

The embodiments shown in FIGS. 5, 6 enable an improvement in efficiency compared to the embodiments in FIGS. 1-4, as the power transfer efficiency of the optocoupler section can be significantly less than unity. In FIGS. 5, 6, part of the power passes directly from the input 2 to the output 3, so that only part of the power passing from the input to the output is transferred through the optocoupler region, and therefore the impact on overall efficiency due to the less than unity optocoupler power transfer efficiency is reduced.

Monolithic Optocoupler Design

Optocouplers are a common device in a variety of applications, and usually discrete devices for photon generation and photon absorption. Separate components increases cost and makes efficient optical coupling difficult to achieve. Generally, optocoupler devices are used for signal transmission and electrical isolation, not for efficient power transfer. Monolithic optical emitter/detector devices have been demonstrated which improve the coupling efficiency of photons. For example, U.S. Pat. No. 4,275,404 to Cassiday et al. devised a device where an LED emitter is positioned in between two photodiode devices, all made from the same epitaxially grown layers, on an insulating substrate. The emission from the side of the LED section is coupled into the photodetector sections, creating an opto-isolator. Vertical optical connections have also been demonstrated, for example by U.S. Pat. No. 5,753,928 to Krause et al. Here, a single emitter region is stacked monolithically with a detector region to produce a monolithic optical emitter-detector. Voltage multiplication has also been demonstrated in devices such as the Toshiba TLP590B. Here a single discrete LED is optically coupled to a series-connected silicon photodiode array to produce a greater voltage output. However, the power transfer efficiency of this device is very low due to the highly inefficient production, transfer and electrical conversion of photons in the device.

To achieve high power transfer efficiency, a device is provided where the photon generation and absorption are performed by different regions of the same monolithic device, separated by transparent, highly resistive, monolithic isolation layers. Step-up or step-down voltage conversion is possible if the light emitting or light absorbing regions are made up of multiple devices connected in series. High efficiency photon capture is enabled by using one or more high reflectivity mirrors or a sandwiched structure, where PV regions surround a light emitting region in monolithic stack.

Figure 7A:
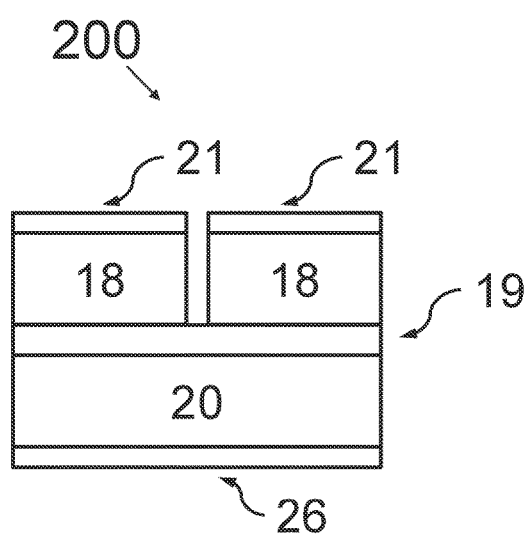
FIGS. 7(*a*), 7(*b*) show a voltage reducing optocoupler device.
Figure 7B:
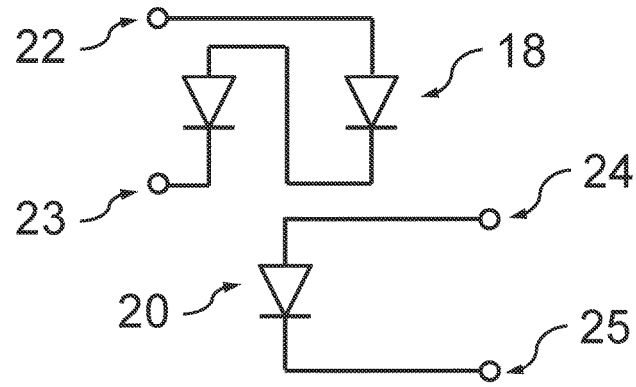

FIG. 7(*a*) shows a schematic drawing of an example voltage reducing optocoupler device 200 having monolithic light emitting devices 18 and monolithic photovoltaic devices 20. Here two light emitting regions 18, for example GaAs pn junctions, are connected to a blocking region 19. The blocking region is a material layer, or combination of material layers, with high transparency to the light emitting section luminescence and high electrical resistance, for example a vertical stack of one or more AlGaAs pn junctions. The blocking region 19 allows photons through, but blocks electrical current, i.e., has a high electrical resistance. The blocking region is connected to a photovoltaic region 20. The bandgap of the lowest bandgap absorber layer in the solar cell region should be equal to or less than the bandgap of the light emitting section governing the peak emission wavelength.

An optional reflector 21 on the light emitting section devices functions to improve the coupling efficiency of photons to the photovoltaic region 20. This could be an epitaxially-grown reflector such as a distributed Bragg reflector (DBR), or a separately deposited reflector such as a dielectric DBR or metal mirror. An optional reflector 26 on the photovoltaic region device functions to improve the absorption probability of photons emitted from the light emitting region 18 in the photovoltaic region 20.

The reflectors 21, 26, photovoltaic region 20, blocking region 19, and light emitting regions 18 each have linear flat top and bottom surfaces and can all have substantially the same length and width, though the light emitting regions 18 can be one device or multiple separate devices, as shown, so that the light emitting regions 18 extend substantially along the blocking region 19 and photovoltaic region 20. The bottom surface of the photovoltaic region is mounted on (i.e., coupled) to the top surface of the first reflector 26, and the top surface of the photovoltaic region 20 is coupled to the bottom surface of the blocking region 19. The one or more light emitting regions 18 can be mounted (at the bottom surface of the light emitting regions 18) to the top surface of the blocking region 19. The bottom surface of the second reflector(s) 21 are coupled to the top surface of the light emitting regions 18. There can be a gap between the light emitting regions 18, as shown, or no gap. Thus, the elements are stacked in a vertical configuration.

In physically separate components, there are reflection losses for light escaping the LED, then again entering the photovoltaic. Furthermore, only light emitted within the escape cone of the LED can escape, the rest is reflected back into the LED by total internal reflection. In the monolithic optocoupler of the present invention, the refractive index of the LED 8 and PV 9 are very similar, so the critical angle is almost 90 degrees, suppressing the escape cone limitation and reflection loss. Another benefit of a monolithic device is that the LED 8 and PV devices 9 are aligned in close proximity. The other typical loss is that 50% of the LED light is emitted in the direction away from the PV device, but the mirror serves to reflect that light back toward the PV device.

FIGS. 1-6 can use any suitable optocoupler device 102. In addition, the optocoupler devices of FIGS. 7-17 can be used in any suitable circuit configuration, such as for example, as photovoltaic output optocouplers. One application for these is for MOSFET gate driving.

However, FIGS. 7-17 are all examples of the structure which could be used for the optocoupler section 102 of the regulators 100 shown in FIGS. 1-6. In that instance, the optocoupler device 100 of FIGS. 1-6 are represented as the optocoupler devices 200 of FIGS. 7-17. And, the light emitting device 18 and PV devices 20 of FIGS. 7-17 correspond to the light emitting devices 8 and PV devices 9 of FIGS. 1-6.

Referring to FIG. 7(*b*), the light emitting region 18 has two terminals 22 and 23, and in this example, two light emitting devices connected in electrical series. The photovoltaic region 20 has two terminals 24 and 25, and one photovoltaic device. The photovoltaic device can be centered and positioned between the two light emitting devices. When the bandgap energy of the light emitting and photovoltaic devices are similar, the input voltages between terminals 22 and 23 is roughly a factor of two or more greater than the voltage between terminals 24 and 25. This could be an epitaxially-grown reflector such as a distributed Bragg reflector (DBR), or a separately deposited reflector such as a dielectric DBR or metal mirror.

Figure 8A:
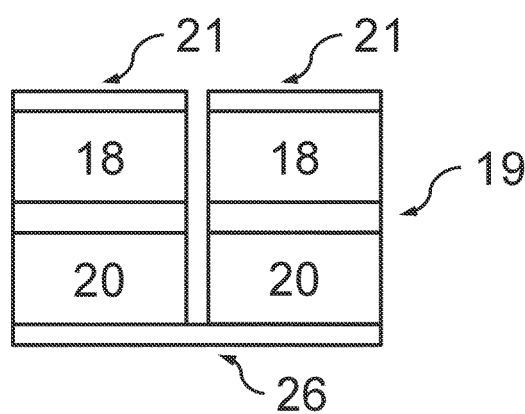
FIGS. 8(*a*), 8(*b*) show a voltage reducing optocoupler device having multiple photovoltaic regions and blocking regions.
Figure 8B:
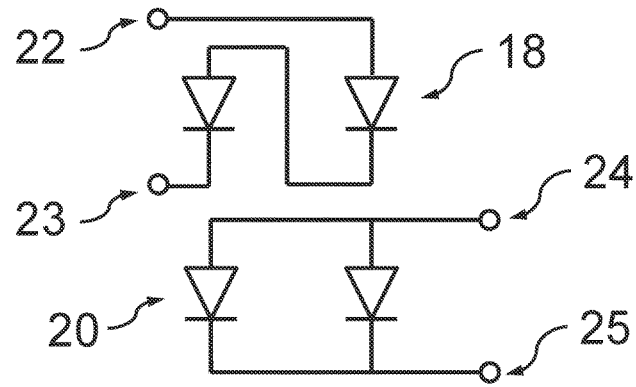

The example in FIG. 7 contains a single photovoltaic device large enough to accept photons from both devices in the light emitting regions 18. Alternatively, as shown in FIGS. 8(*a*), 8(*b*), an equivalent scheme could use two photovoltaic devices 20 connected in parallel, one for each light emitting region 18, and with a respective blocking device 19. In general, a single optocoupler may have one (1) light emitting device and one (1) photovoltaic device, or any number of series or parallel connected light emitting and photovoltaic devices with any ratio of device areas.

In FIG. 8, having 1 LED and 1 PV per individual monolithic stack provides a basic building block to get a large number of possible ratios of voltage between LED and PV strings by connecting arbitrary numbers of them in any series/parallel combination, whereas FIG. 7 gives a fixed 2:1 combination. However, additional metal interconnections are needed in FIG. 8 to achieve the same result as in FIG. 7, which may introduce more series resistance.

FIGS. 9(*a*), 9(*b*) show an alternative example non-limiting configuration for reducing voltage. In this example, the optocoupler includes two light emitting regions 18 which are connected to two blocking regions 19 which are connected to a single photovoltaic region 20, in a vertically stacked configuration. Each light emitting region 18 contains an optional reflector 21 to improve the coupling efficiency of photons to the photovoltaic region 20. As before, the bandgap of the lowest energy absorber layer in the solar cell sections should be equal to or less than the bandgap of the light emitting section governing the peak emission wavelength. The light emitting region 18 contains two terminals 22, 23 and, in this example, two light emitting devices connected in electrical series. The photovoltaic region 20 contains two terminals 24, 25 and one photovoltaic device. When the bandgap energy of the light emitting and photovoltaic devices are similar, the input voltages between terminals 22, 23 is roughly a factor of two or more greater than the voltage between terminals 24, 25.

Figure 10A:
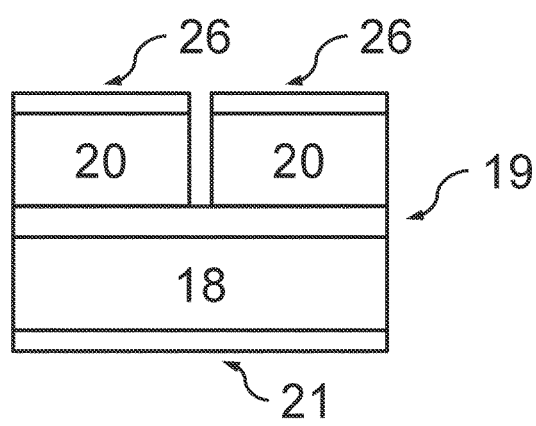
FIGS. 10(*a*), 10(*b*) show a voltage reducing optocoupler device having the light emitting region on the bottom and the photovoltaic regions on top.
Figure 10B:
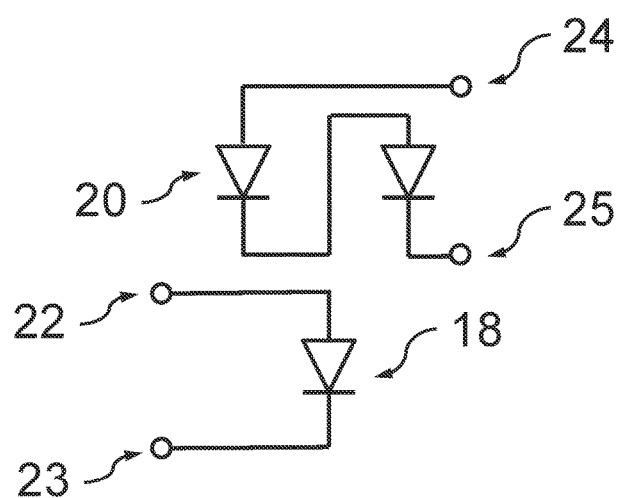

In the case that the bandgap of the light emitting regions 18 and the photovoltaic regions 20 of the devices in FIGS. 8-10 are equal, in principle the optocoupler can operate also as a voltage increasing device. This is achieved by operating the PV section as a light emitter and the light emitter region as a photovoltaic. However, to achieve high power transfer efficiency, it is often advantageous to optimize the layer structure to perform for either one of step-up or step-down operations.

FIG. 10(*a*) shows an example configuration for the device as a voltage increasing device. Here a single light emitting region 18 is connected to a blocking region 19. The blocking region is connected to a photovoltaic region comprising two separate photovoltaic devices 20. The bandgap of the lowest bandgap absorber layer in the solar cell region should be equal to or less than the bandgap of the light emitting section governing the peak emission wavelength. An optional reflector 21 on the light emitting section devices functions to improve the coupling efficiency of photons to the photovoltaic region 20. Thus, the light emitting region 18 is on the bottom and the photovoltaic regions 20 are on top.

Figure 11A:
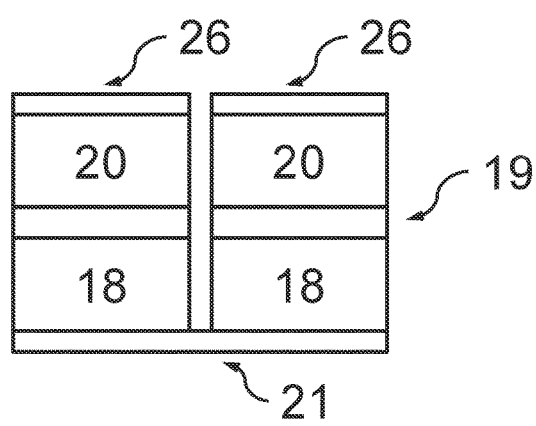
FIGS. 11(*a*), 11(*b*) show a voltage reducing optocoupler device with multiple light emitting regions on the bottom and the photovoltaic regions on top.
Figure 11B:
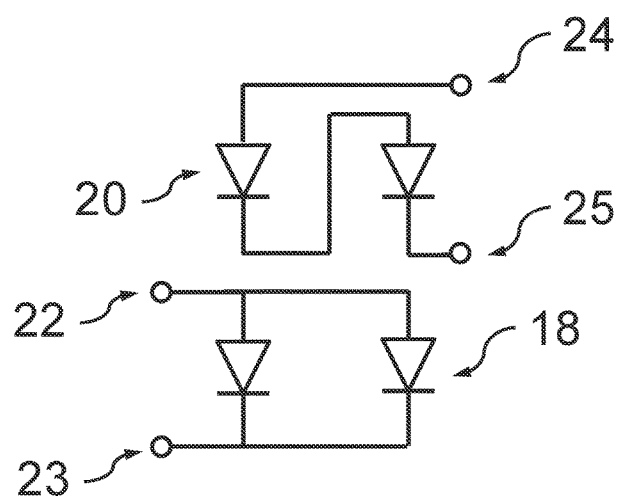

As shown in FIG. 10(*b*), the light emitting region 18 contains two terminals 22, 23 and, in this example, comprises a single light emitting device. The photovoltaic region 20 contains two terminals 24, 25 and comprises two photovoltaic devices connected in electrical series. When the bandgap energy of the light emitting and photovoltaic devices are similar, the output voltages between terminals 24, 25 is roughly a factor of two greater than the voltage between terminals 22, 23. An optional reflector 26 on the photovoltaic region device functions to improve the absorption probability of photons emitted from the light emitting region 18 in the photovoltaic region 20. The example in FIG. 10 contains a single light emitting device large enough to provide photons to both devices in the photovoltaic region 20. Alternatively, an equivalent scheme could use two light emitting devices connected in parallel, as shown in FIG. 11.

FIG. 12 shows an alternative method for increasing voltage. In this example, the optocoupler includes two photovoltaic regions 20 which are connected to two blocking regions 19 which are connected to a single light emitting region 18. Each photovoltaic region contains an optional reflector 26 to improve the coupling efficiency of photons to the photovoltaic region 20.

As before, the bandgap of the lowest energy absorber layer in the solar cell sections should be equal to or less than the bandgap of the light emitting section governing the peak emission wavelength. The light emitting region 18 contains two terminals 22, 23 and, in this example, comprises a single light emitting device. The photovoltaic region 20 contains two terminals 24, 25 and comprises two photovoltaic devices connected in electrical series.

When the bandgap energy of the light emitting and photovoltaic devices are similar, the output voltages between terminals 24, 25 is roughly a factor of two or more greater than the voltage between terminals 22, 23. The design can be easily adapted to providing greater voltage steps by using multijunction photovoltaic devices in the photovoltaic region 20. For example, the photovoltaic devices could each contain two np junctions separated by tunnel junctions, where the separate junctions are designed to produce similar photocurrent under illumination from the photons emitted by the light emitting region. In FIG. 12, the collection of LED emission is extremely good, as light escaping from the upper and lower surfaces of the LED 18 will end up reaching a PV device. When compares this to using a reflector on the LED to boost the probability of absorption in the PV device, as in FIGS. 7, 8, even the best reflector will not achieve close to 100% reflection over all angles, so some loss is inevitable. This is probably the highest potential efficiency version of the optocoupler.

Figure 13:
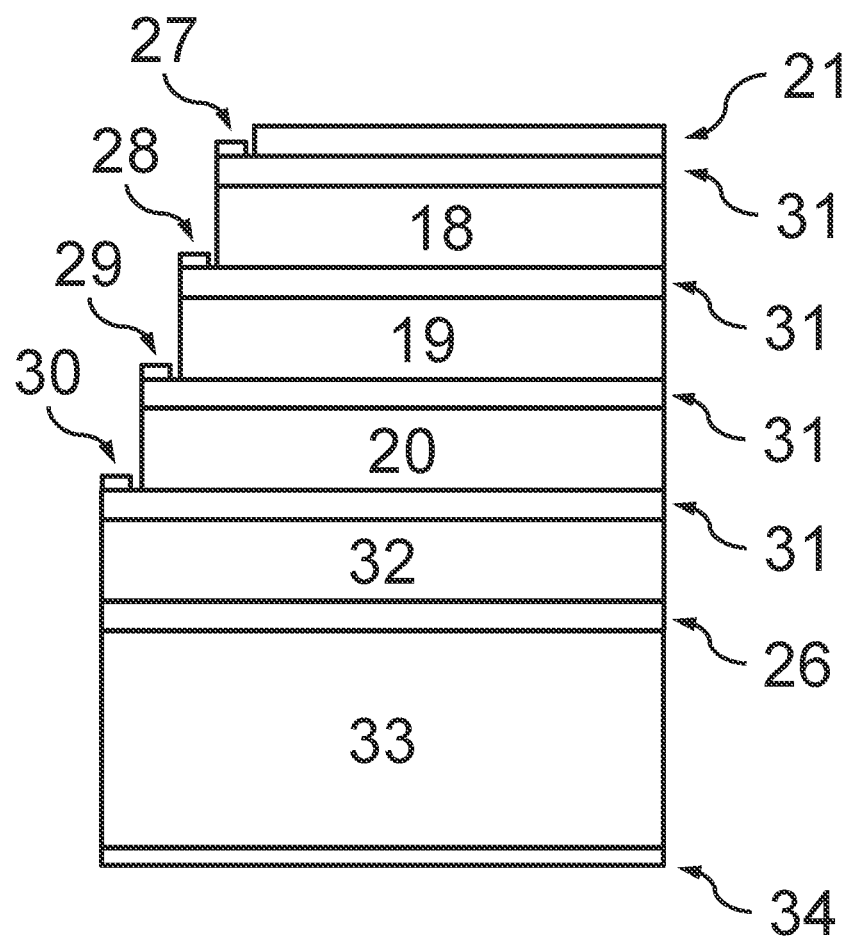
FIGS. 13, 14 show voltage reducing optocoupler devices having a horizontal side-by-side configuration.

FIG. 13 shows another example non-limiting example structure for a monolithic optocoupler. In FIG. 13, the components are arranged vertically with respect to one another, i.e., with one on top of another and tapered so that each component is slightly smaller. This example contains one light emitting section 18 and one photovoltaic section 20. The light emitting section 18 has a p-n junction or p-i-n junction diode structure. The polarity of the n and p materials may be in either in n-on-p or p-on-n geometry. The light emitting section may consist of bulk semiconductors, such as $Al_xGa_{1-x}As$ or $In_xGa_{1-x}P$, in any combination of homojunction or heterojunction architectures. A region with dissimilar composition may be employed close to or within the p-n junction region, or in an intrinsic region for p-i-n structures. This dissimilar region may consist of a material with different bandgap to the surrounding semiconductors, or a low dimensional semiconductor such as single or multi-quantum wells, quantum dots or a superlattice structure. The n and p layers of the light emitter junction may contain wider bandgap outer cladding layers.

A high impedance blocking region 19 is situated between the light emitting section and PV section. This should be composed of semiconductors with a bandgap wide enough to ensure high transmission probability of photons generated in the light emitter region. The structure may have one or more resistive semiconductor layers with low electrically active doping concentration, or one or more diodes formed by p-n or p-i-n junctions.

The photovoltaic region 20 has a p-n junction or p-i-n junction. The device may include bulk semiconductors, such as $Al_xGa_{1-x}As$ or $In_xGa_{1-x}P$, in any combination of homojunction or heterojunction architectures. A region with dissimilar composition may be employed close to or within the p-n junction region, or in an intrinsic region for p-i-n structures. This dissimilar region may consist of a material with different bandgap to the surrounding semiconductors, or a low dimensional semiconductor such as single or multi-quantum wells, quantum dots or a superlattice structure. The photovoltaic device will contain one or more semiconductor layers with bandgap equal to or less than the bandgap of the layers responsible for the emission in the light emitting section, and therefore able to absorb the emitted photons. The n and p layers of the PV junction may contain wider bandgap outer cladding layers.

A highly doped semiconductor region 31 is positioned between the reflector 21 and the LED 18, between the LED 18 and the blocking layer 19, between the blocking layer 19 and the photovoltaic layer 20, between the PV layer 20 and the high resistance region 32, as shown. The light emitter region 18 and cladding is surrounded by highly doped semiconductor regions 31 having one or more layers, used to form ohmic contact with metals. The highly doped semiconductors should have a bandgap wide enough to ensure high transmission probability of photons generated in the light emitter region. Two metal contact structures 27, 28 contact the highly doped semiconductor layer 31 surrounding the light emitting section to form the two electrical terminals of the light emitting region. An optional reflector 21 on the light emitting section devices functions to improve the coupling efficiency of photons to the photovoltaic region 20. The reflector may form part of the ohmic contact 27 to the light emitting device, or be a separate structure not forming an electrical connection.

The photovoltaic region 20 and any cladding layers are surrounded by highly doped semiconductor regions 31 having one or more highly doped semiconductor layers are used to form ohmic contact with metals. This should have a bandgap wide enough to ensure high transmission probability of photons generated in the light emitter region. Two metal contact structures 29, 30 contact the highly doped semiconductor regions 31 surrounding the photovoltaic region to form the two electrical terminals of the photovoltaic region 20.

An optional, additional high resistance region 32 containing one or more resistive semiconductor layers with low electrically active doping concentration, or one or more diodes formed by p-n or p-i-n junctions, may be included below the PV region. This creates electrical isolation between adjacent die on the same substrate, if required. Alternatively, the die may be grown on an insulating substrate, or diced into separate components to achieve electrical isolation, if required. If grown on a conducting substrate 33, electrical contact to the photovoltaic region 20 may be made through a metal contact connected to the rear side of the substrate 34. A highly reflective mirror 26 may be included below the PV section of the device to improve the probability of absorption in that section.

One or more tunnel junctions may be included in the device to improve the electrical resistance in ohmic contact layers. The tunnel junction layers could be positioned between an ohmic contact layer and a PV or LED section of the device, with the purpose of changing the polarity of the ohmic contact layer to enable lower series resistance operation.

Figure 14:
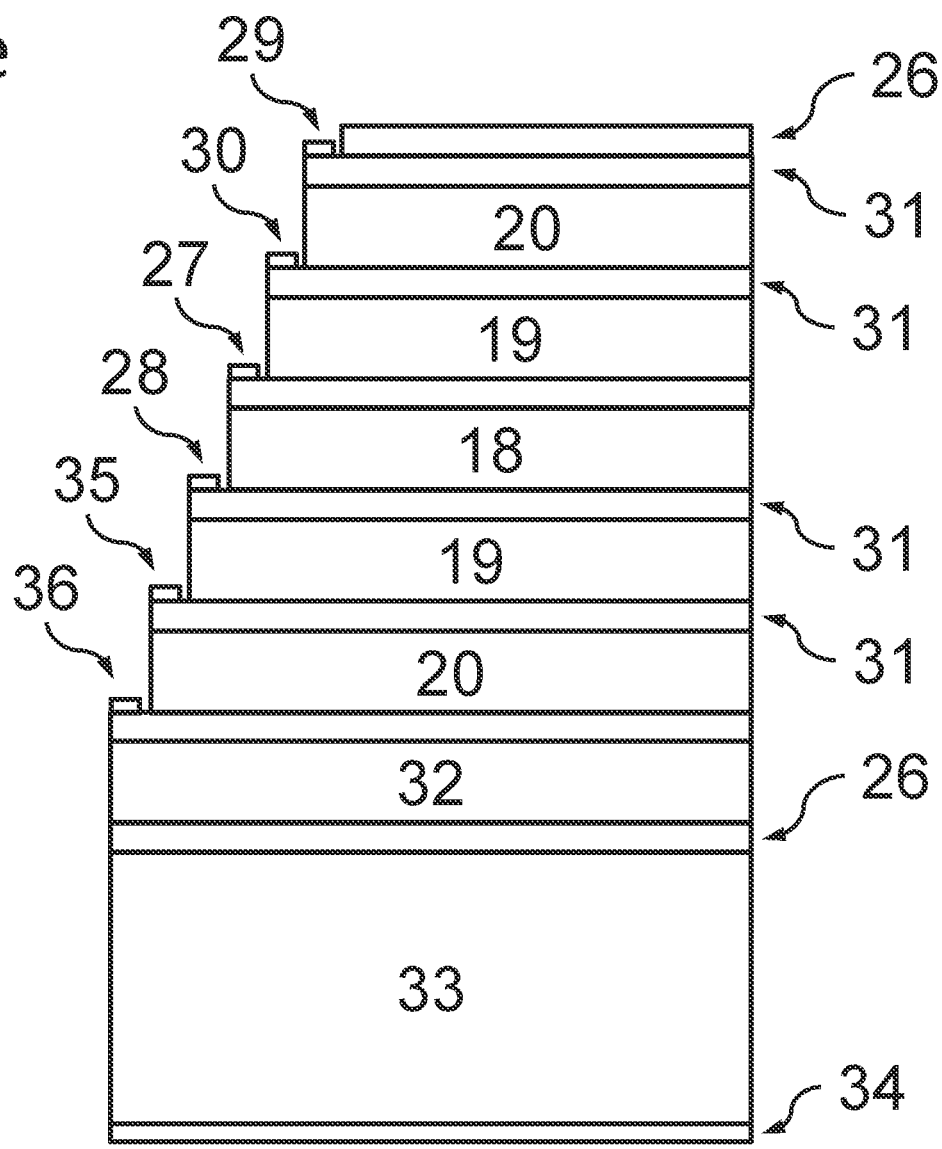

FIG. 14 shows an alternative device structure for a monolithic optocoupler having a side-by-side horizontal configuration as in FIG. 13. This example contains one light emitting section 18 and two photovoltaic sections 20 each with the same basic structure as those described in FIG. 13. A high impedance blocking region 19 is situated between each light emitting section and PV section. The light emitter region 18 and cladding is surrounded by highly doped semiconductor regions 31. Two metal contact structures 27, 28 make contact with the highly doped semiconductor layer 31 surrounding the light emitting section to form the two electrical terminals of the light emitting region. The light emitter regions 20 and cladding are surrounded by highly doped semiconductor regions 31. Four metal contact structures 29, 30, 35, 36 make contact with the highly doped semiconductor layers 31 surrounding the two photovoltaic regions. An optional reflector 26 is positioned above the topmost photovoltaic region. This may be a separate structure or form the ohmic contact 29 to the topmost photovoltaic region.

An optional, additional high resistance region 32 containing one or more resistive semiconductor layers with low electrically active doping concentration, or one or more diodes formed by p-n or p-i-n junctions, may be included below the lowermost PV region. This creates electrical isolation between adjacent die on the same substrate, if required. Alternatively, the die may be grown on an insulating substrate, or diced into separate components to achieve electrical isolation, if required. If grown on a conducting substrate 33, electrical contact to the photovoltaic region 20 may be made through a metal contact connected to the rear side of the substrate 34. A highly reflective mirror 26 may be included below the PV section of the device to improve the probability of absorption in that section.

As in FIG. 13, one or more tunnel junctions may be included in the device to improve the electrical resistance in ohmic contact layers. The tunnel junction layers could be positioned between an ohmic contact layer and a PV or LED section of the device, with the purpose of changing the polarity of the ohmic contact layer to enable lower series resistance operation.

Separate Components

Figure 15:
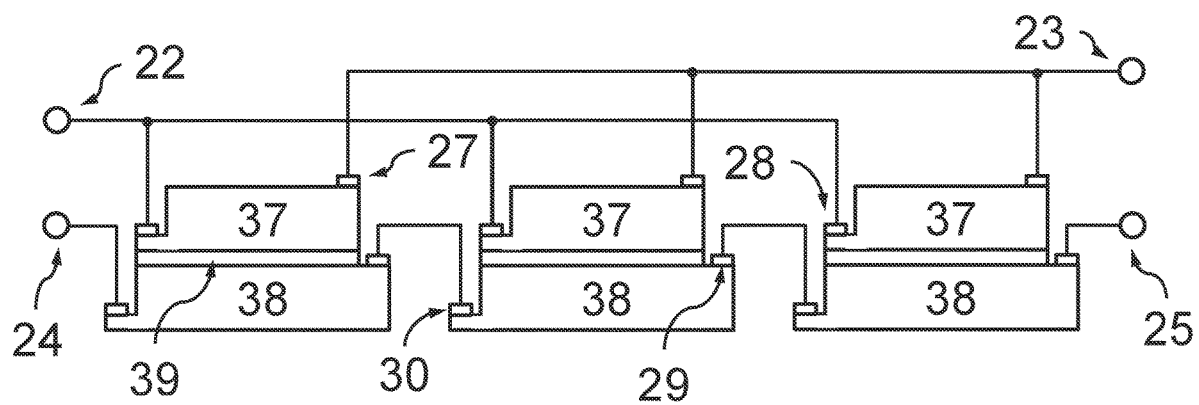
FIGS. 15-17 show voltage reducing optocoupler device assemblies.

The optical coupling section of the voltage regulator device may also be constructed using separate components. FIG. 15 shows an example optical coupling scheme using separate light emitting and photovoltaic components. The light emitters can include three separate light emitting devices 37, each with two metal contact structures 27, 28 for making electrical contact to the anode and cathode of each device. The light emitting devices are connected together in some in some combination of series and parallel, with two terminals 22, 23 (one connected to the transistor 1 and the other to ground). The photovoltaics can have three separate photovoltaic devices 38, each with two metal contact structures 29, 30 for making electrical contact to the anode and cathode of each device. The photovoltaic devices are connected together in some in some combination of series and parallel, with two output terminals 24, 25.

The PV and LED components may be bonded together vertically using an adhesive 39, a direct Van der Waals bond or some other semiconductor bonding approach. Alternatively, the devices may be in close vertical proximity but not in intimate contact. The surfaces of the LED and PV devices may have suitable coatings applied to reduce reflection losses. The example in FIG. 15 contains three LED devices in parallel and 3 PV devices in series but can contain any number of photovoltaic and light emitting devices in any combination of series/parallel interconnection. In the embodiment shown, the light emitting devices 37 are stacked vertically on top of the photovoltaic devices 38.

Figure 16:
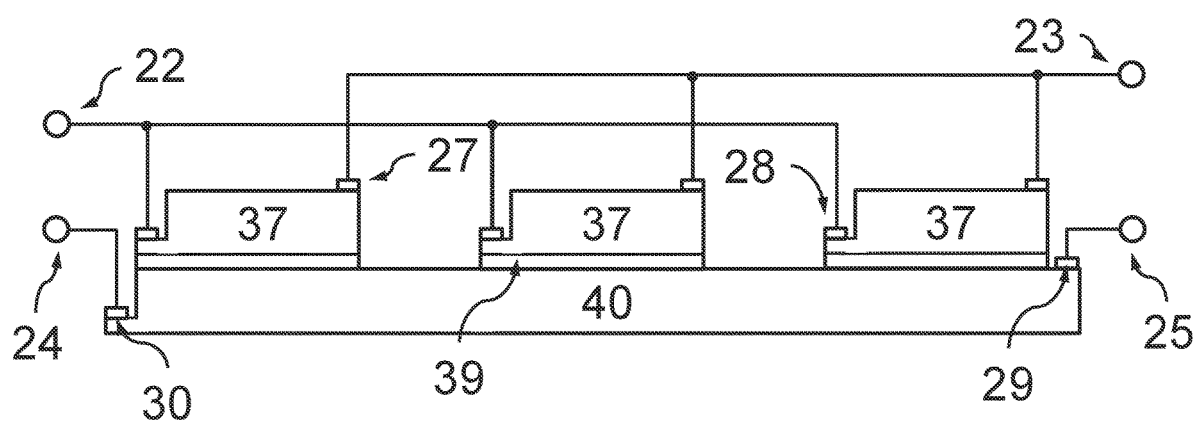
Figure 17:
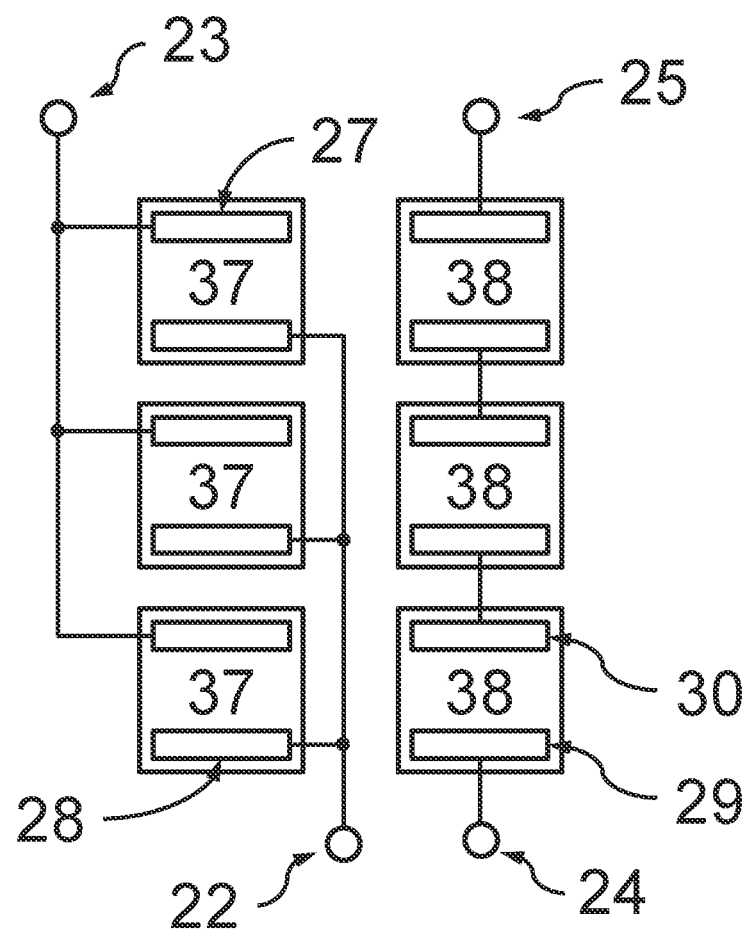

As an alternative to FIG. 15, several photovoltaic or light emitting devices may be replaced by one large photovoltaic or light emitting device. For example, FIG. 16 shows one large photovoltaic device (0) replacing three parallel connected photovoltaics in FIG. 15. The optical coupling may also be between adjacent devices with horizontal photon transfer. In FIG. 17, the light emitters comprise three separate light emitting devices 37, each with two metal contact structures 27, 28 for making electrical contact to the anode and cathode of each device. The light emitting devices are connected together in some in some combination of series and parallel, with two terminals 22, 23. The PV devices are in close proximity to the light emitting devices and photons from the LED device are passed to one or more PV devices via emission from the edge of the LED mesa. The photovoltaics comprise three separate photovoltaic devices 38, each with two metal contact structures 29, 30 for making electrical contact to the anode and cathode of each device. The photovoltaic devices are connected together in some in some combination of series and parallel, with two terminals 24, 25. The LED and PV mesas may be encapsulated in a material transparent to the LED emission wavelength, or unencapsulated. Series and parallel connections can then be formed by connecting the terminals of the PV and LED devices in arbitrary series/parallel combinations. An example with three LED devices in parallel and 3 PV devices in series is shown in FIG. 17.

The LEDs 8, 18 are in close proximity to the PV devices 9, 20, respectively. There is no strict limit on how far they can be, but generally as close as possible would work best for efficient optical coupling, as the light from the LEDs is diverging and the PV device is required to capture as much of the LED light as possible. A greater separation is desirable for galvanic isolation. A typical vertical configuration would range from direct and intimate contact to as far as several mm of separation.

It is further noted that the description and claims use several geometric or relational terms, such as rectangular, series, side-by-side, vertical, horizontal, parallel, and flat. In addition, the description and claims use several directional or positioning terms and the like, such as top and bottom. Those terms are merely for convenience to facilitate the description based on the embodiments shown in the figures. Those terms are not intended to limit the invention. Thus, it should be recognized that the invention can be described in other ways without those geometric, relational, directional or positioning terms. In addition, the geometric or relational terms may not be exact. For instance, walls may not be exactly parallel to one another but still be considered to be substantially parallel because of, for example, roughness of surfaces, tolerances allowed in manufacturing, etc. And, other suitable geometries and relationships can be provided without departing from the spirit and scope of the invention.

FIGURE NUMBERS

1. Transistor
2. Input voltage terminal
3. Output voltage terminal
4. Voltage reference
5. Error amplifier
6. Potential divider resistor 1
7. Potential divider resistor 2
8. Light emitting section
9. Photovoltaic section
10. Photon path
11. Pnp transistor
12. $2^{nd}$ transistor
13. Phototransistor
14. Light emitting device
15. Pnp phototransistor
16. Conventional linear voltage regulator
17. Switch
18. Light emitting section
19. Blocking section
20. Photovoltaic section
21. Light emitter Reflector
22. Light emitter section terminal 1
23. Light emitter section terminal 2
24. Photovoltaic section terminal 1
25. Photovoltaic section terminal 2
26. Optional PV reflector
27. Light emitter $1^{st}$ contact metal
28. Light emitter $2^{nd}$ contact metal
29. Photovoltaic $1^{st}$ contact metal
30. Photovoltaic $2^{nd}$ contact metal
31. Highly doped semiconductor contact layer
32. Optional blocking section
33. Substrate
34. Optional substrate contact
35. Photovoltaic section $3^{rd}$ contact metal
36. Photovoltaic section $4^{th}$ contact metal
37. Separate light emitting device
38. Separate photovoltaic device 39. Interface layer (adhesive)
40. Single large area photovoltaic device It is noted that the statements made with respect to one embodiment apply to the other embodiments, unless otherwise specifically noted. For example, the statements regarding FIG. 1 with respect to configuration and operation apply equally to the embodiments of FIGS. 2-6 and also 7-17, and the statements made with respect to FIG. 7 apply to the embodiments of FIGS. 1-6 and also 8-17. It is further understood that the description and scope of invention apply equally (though the descriptions have not been repeated) for each structure that is the same or similar between each of the various embodiment, and whether or not those structures have been assigned a similar reference numeral.

The foregoing description and drawings should be considered as illustrative only of the principles of the invention. The invention may be configured in a variety of manners and is not intended to be limited by the embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A monolithic optocoupler device, comprising:
a substrate;
a photovoltaic region, deposited on the substrate in a vertical stack, that absorbs photons;
a light emitting region, deposited on the substrate in the vertical stack, that emits photons responsive to an electrical input; and
an electrically isolating region, deposited on the substrate in the vertical stack between the photovoltaic region and the light emitting region, that allows photons to pass from the light emitting region to the photovoltaic region while blocking electrical current between the photovoltaic region and the light emitting region.

2. The optocoupler device of claim 1, wherein the electrically isolating region comprises one or more resistive semiconductor layers or one or more diodes formed by p-n or p-i-n junctions.

3. The optocoupler device of claim 1, further comprising:
a light emitting region reflector, on a side of the light emitting region opposite the photovoltaic region, that reflects photons emitted by the light emitting region back toward the photovoltaic region.

4. The optocoupler device of claim 3, further comprising:
a photovoltaic region reflector, on a side of the photovoltaic region opposite the light emitting region, that reflects photons emitted by the light emitting region back toward the photovoltaic region.

5. The optocoupler device of claim 1, wherein the photovoltaic region is a first photovoltaic region and the electrically isolating region is a first electrically isolating region, the optocoupler device further comprising:
a second photovoltaic region, on a side of the light emitting region opposite the first photovoltaic region; and
a second electrically isolating region, between the second photovoltaic region and the light emitting region, that allows photons to pass from the light emitting region to the second photovoltaic region while blocking electrical current between the second photovoltaic region and the light emitting region.

6. The optocoupler device of claim 5, further comprising:
a first photovoltaic region reflector, on a side of the first photovoltaic region opposite the light emitting region, that reflects photons emitted by the light emitting region back toward the second photovoltaic region; and
a second photovoltaic region reflector, on a side of the second photovoltaic region opposite the light emitting region, that reflects photons emitted by the light emitting region back toward the second photovoltaic region.

7. The optocoupler device of claim 1, wherein the light emitting region is a first light emitting region and the electrically isolating region is a first electrically isolating region, the optocoupler device further comprising:
a second light emitting region, on a side of the photovoltaic region opposite the first light emitting region; and
a second electrically isolating region, between the second light emitting region and the photovoltaic region, that allows photons to pass from the second light emitting region to the photovoltaic region while blocking electrical current between the photovoltaic region and the second light emitting region.

8. The optocoupler device of claim 7, further comprising:
a first light emitting region reflector, on a side of the first light emitting region opposite the photovoltaic region, that reflects photons emitted by the first light emitting region back toward the photovoltaic region; and
a second light emitting region reflector, on a side of the second light emitting region opposite the photovoltaic region, that reflects photons emitted by the second light emitting region back toward the photovoltaic region.

9. The optocoupler device of claim 1, wherein the photovoltaic region comprises a plurality of photovoltaic devices.

10. The optocoupler device of claim 6, wherein each of the photovoltaic devices include an anode and a cathode, the anodes and cathodes enabling the photovoltaic devices to be connected in series and/or parallel.

11. The optocoupler device of claim 1, wherein the light emitting region comprises a plurality of light emitting devices.

12. The optocoupler device of claim 11, wherein each of the light emitting devices include an anode and a cathode, the anodes and cathodes enabling the light emitting devices to be connected in series and/or parallel.

13. The optocoupler device of claim 1, wherein a bandgap of a lowest energy absorber layer in the photovoltaic section is equal to or less than a bandgap of the light emitting section governing the peak emission wavelength of the light emitting section.

14. The optocoupler device of claim 1, wherein a bandgap of the photovoltaic section is substantially equal to a bandgap of the light emitting section such that the photovoltaic section is configured to emit photons in response to an electrical current and the light emitting section is configured to absorb photons emitted by the photovoltaic section.

15. The optocoupler device of claim 1, further comprising a semiconductor layer between the electrically isolating region and either the light emitting region or the photovoltaic region.

16. The optocoupler device of claim 15, wherein the semiconductor layer includes an electrical terminal of the light emitting region or the photovoltaic region.

17. The optocoupler device of claim 1, wherein the light emitting region is a light emitting diode.

\* \* \* \* \*